(12) United States Patent
Park et al.

(10) Patent No.: US 12,232,408 B2
(45) Date of Patent: Feb. 18, 2025

(54) SUBSTRATE FOR DISPLAY INCLUDING PLURALITY OF HOLES AND GROOVES

(71) Applicant: LG INNOTEK CO., LTD., Seoul (KR)

(72) Inventors: Duck Hoon Park, Seoul (KR); Hae Sik Kim, Seoul (KR); Woo Young Chang, Seoul (KR); Jee Heum Paik, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 406 days.

(21) Appl. No.: 17/635,058

(22) PCT Filed: Jul. 27, 2020

(86) PCT No.: PCT/KR2020/009877
§ 371 (c)(1),
(2) Date: Feb. 14, 2022

(87) PCT Pub. No.: WO2021/029568
PCT Pub. Date: Feb. 18, 2021

(65) Prior Publication Data
US 2022/0293870 A1 Sep. 15, 2022

(30) Foreign Application Priority Data

Aug. 13, 2019 (KR) .................. 10-2019-0098960
Sep. 5, 2019 (KR) .................. 10-2019-0109858

(51) Int. Cl.
*H10K 50/87* (2023.01)
*H10K 59/40* (2023.01)
(Continued)

(52) U.S. Cl.
CPC ........... *H10K 77/111* (2023.02); *H10K 50/87* (2023.02); *H10K 59/40* (2023.02);
(Continued)

(58) Field of Classification Search
CPC .... H10K 50/87; H10K 59/40; H10K 59/8794; H10K 77/111; H10K 2102/311;
(Continued)

(56) References Cited

U.S. PATENT DOCUMENTS 10,164,208 B2 12/2018 Lee et al.
10,368,452 B2 7/2019 Yun et al.
(Continued)

FOREIGN PATENT DOCUMENTS

JP 2018124503 A * 8/2018 ........... G02F 1/1333
KR 20150020895 A * 2/2015 ............. G09F 9/301
(Continued)

OTHER PUBLICATIONS

International Search Report dated Oct. 30, 2020 issued in Application No. PCT/KR2020/009877.

*Primary Examiner* — Ida M Soward
(74) *Attorney, Agent, or Firm* — KED & Associates LLP

(57) ABSTRACT

A substrate for display comprises one surface, the other surface, a first area (folding area) and a second area (non-folding area). A first hole passing through the one surface and the other surface is formed on the first area. A 1-1 groove is formed on one surface of the first area in the direction from the one surface to the other surface. A 1-2 groove is formed on the other surface of the first area in the direction from the other surface to the one surface. A 2-1 groove is formed on one surface of the second area in the direction from the one surface to the other surface. A 2-2 groove is formed on the other surface of the second area in the direction from the other surface to the one surface. The 1-1 groove and 1-2 groove and the 2-1 groove and 2-2 groove do not overlap each other in the thickness direction of the substrate for display.

20 Claims, 7 Drawing Sheets

(51) Int. Cl.
*H10K 77/10* (2023.01)
*G02F 1/1333* (2006.01)
*G06F 1/16* (2006.01)
*G09F 9/30* (2006.01)
*H10K 102/00* (2023.01)

(52) U.S. Cl.
CPC ...... *G02F 1/133305* (2013.01); *G06F 1/1652* (2013.01); *G09F 9/301* (2013.01); *G09G 2380/02* (2013.01); *H10K 2102/311* (2023.02); *H10K 2102/351* (2023.02)

(58) Field of Classification Search
CPC ............ H10K 2102/351; G02F 1/1333; G06F 1/1652; G09F 9/30; G09F 9/301; G09G 2380/02
See application file for complete search history.

(56) References Cited

U.S. PATENT DOCUMENTS

| | | | |
|---|---|---|---|
| 10,381,581 B2 | 8/2019 | Jeong et al. | |
| 10,485,116 B2 | 11/2019 | Kim | |
| 10,608,024 B2 | 3/2020 | Lee et al. | |
| 10,651,120 B1 * | 5/2020 | Tsai | H10K 77/111 |
| 10,727,435 B2 | 7/2020 | Kim et al. | |
| 10,886,307 B2 * | 1/2021 | Chang | H10K 77/111 |
| 10,936,012 B2 * | 3/2021 | Kim | G02F 1/133308 |
| 11,631,823 B2 * | 4/2023 | Park | H10K 50/844 |
| | | | 257/40 |
| 2015/0102298 A1 * | 4/2015 | Namkung | H10K 77/111 |
| | | | 438/34 |
| 2016/0295685 A1 * | 10/2016 | Ryu | G06F 1/1641 |
| 2018/0124937 A1 * | 5/2018 | Choi | G06F 1/1681 |
| 2018/0150108 A1 * | 5/2018 | Song | H10K 59/40 |
| 2019/0141843 A1 | 5/2019 | Park et al. | |
| 2019/0204872 A1 * | 7/2019 | Lee | G06F 1/1641 |
| 2019/0248102 A1 * | 8/2019 | Song | G02F 1/133305 |

FOREIGN PATENT DOCUMENTS

| | | | | |
|---|---|---|---|---|
| KR | 10-2016-0144912 | | 12/2016 | |
| KR | 10-2017-0137260 | | 12/2017 | |
| KR | 10-1834793 | | 3/2018 | |
| KR | 10-2018-0034780 | | 4/2018 | |
| KR | 10-2018-0062271 | | 6/2018 | |
| KR | 10-2018-0079016 | | 7/2018 | |
| KR | 10-2018-0079091 | | 7/2018 | |
| KR | 20190072237 A | * | 6/2019 | ............ G09F 9/301 |
| KR | 10-2019-0078997 | | 7/2019 | |
| WO | WO-2019138849 A1 | * | 7/2019 | ........... G02F 1/1333 |

* cited by examiner

【FIG. 1】
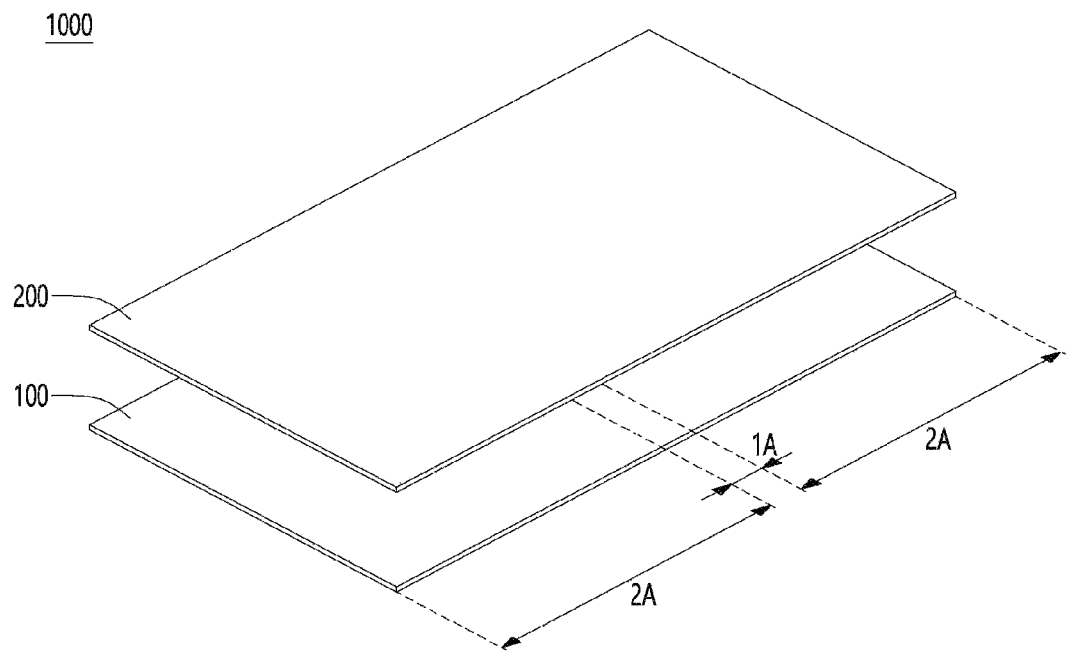
【FIG. 2】
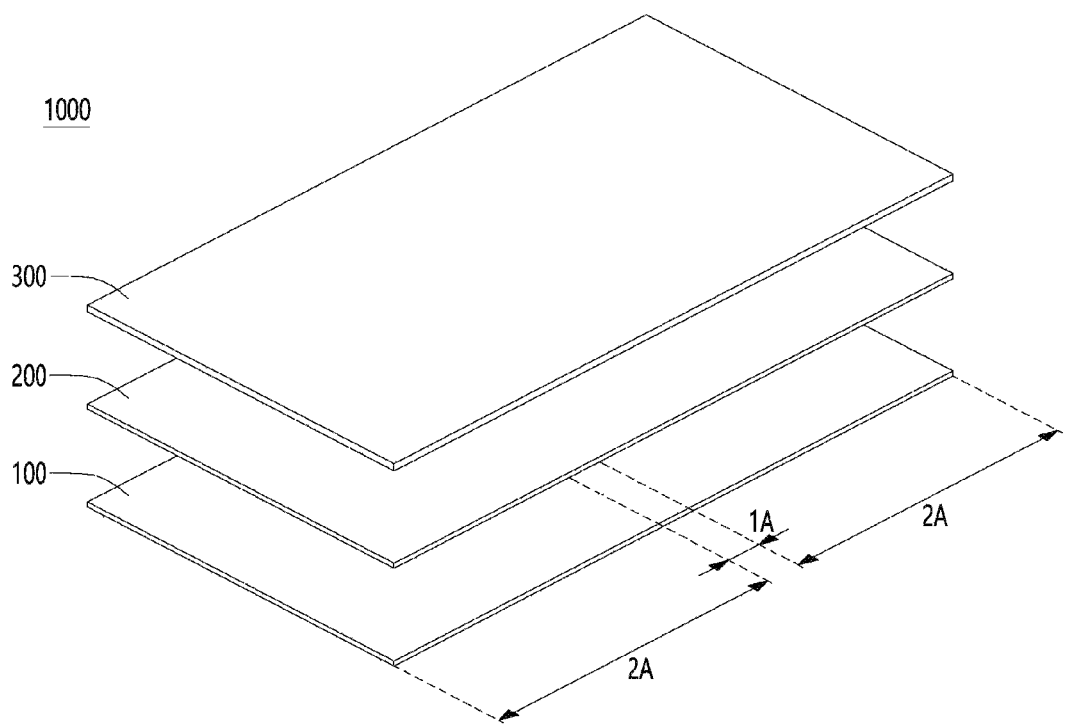

[FIG. 3]
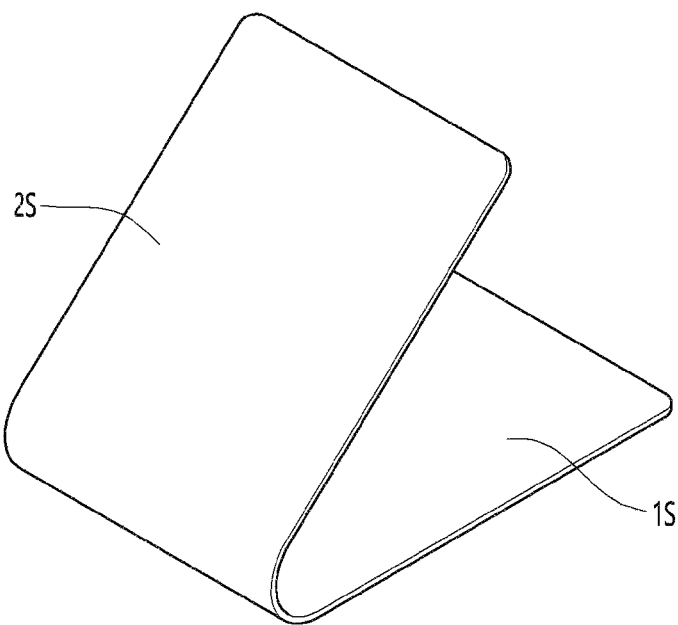
[FIG. 4]
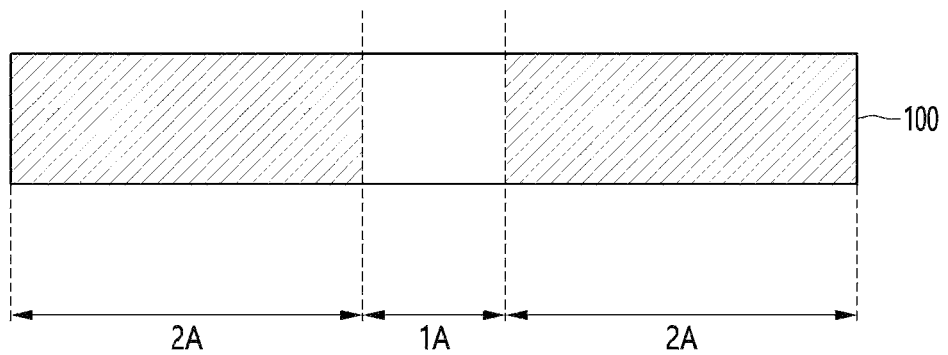

[FIG. 5]
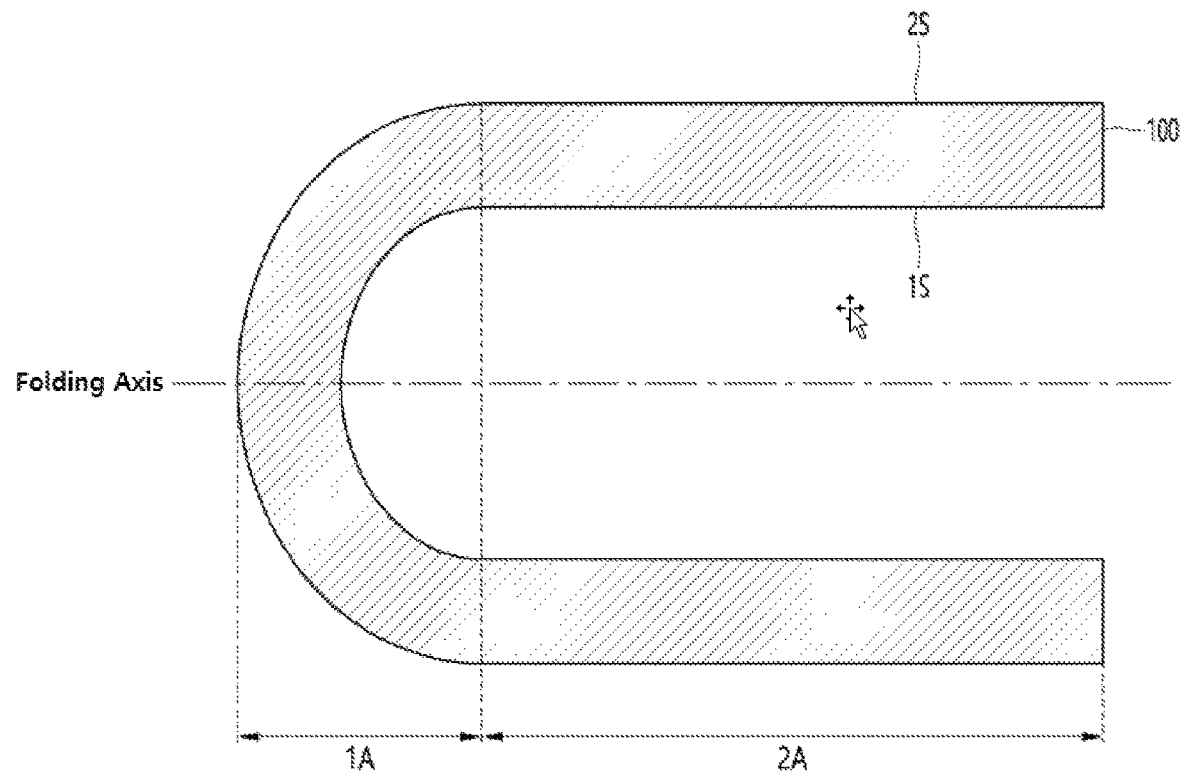
[FIG. 6]
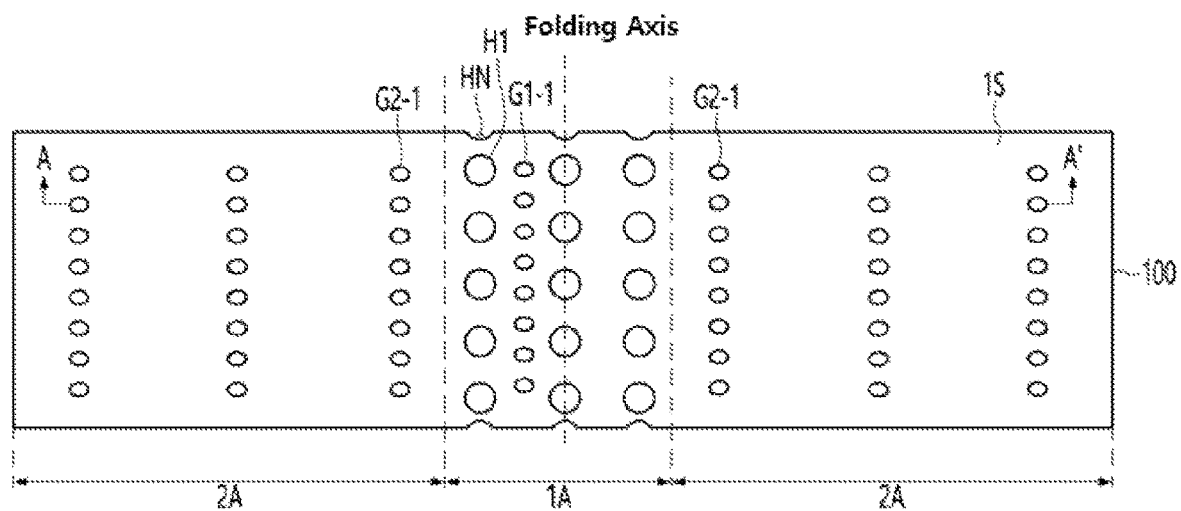

[FIG. 7]
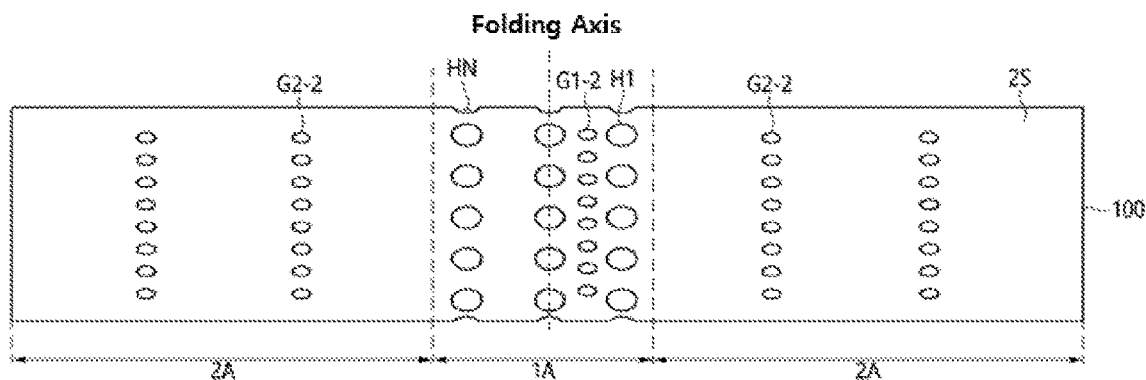
[FIG. 8]
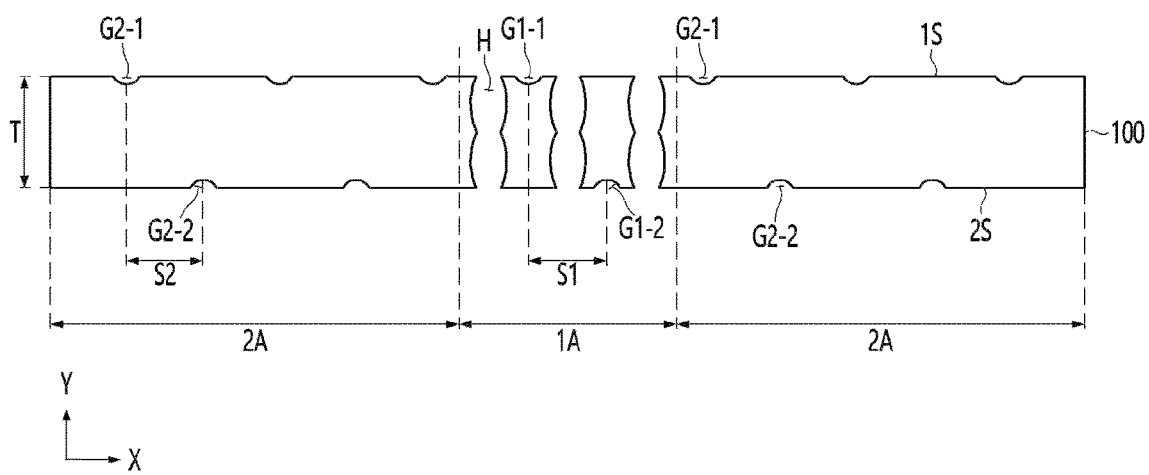
[FIG. 9]
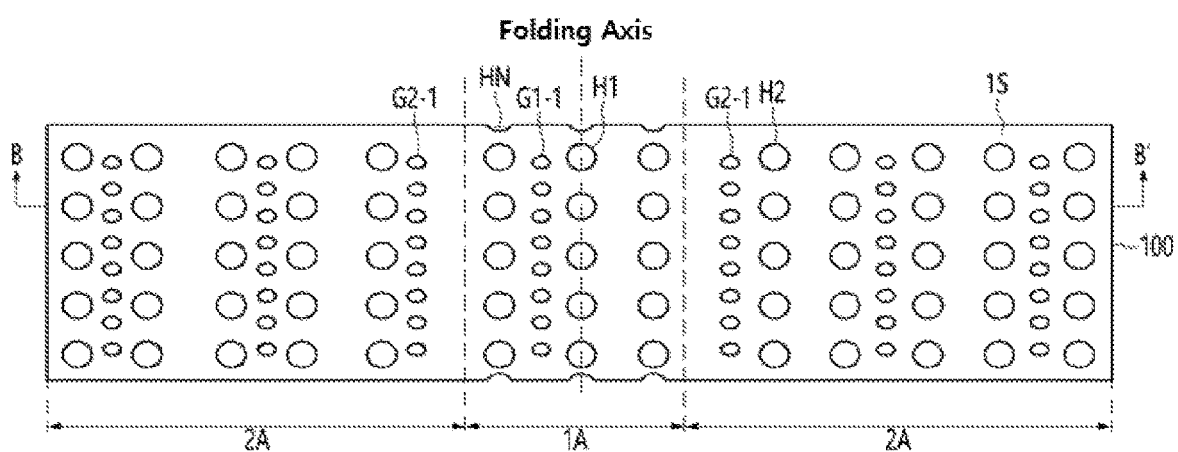

【FIG. 10】
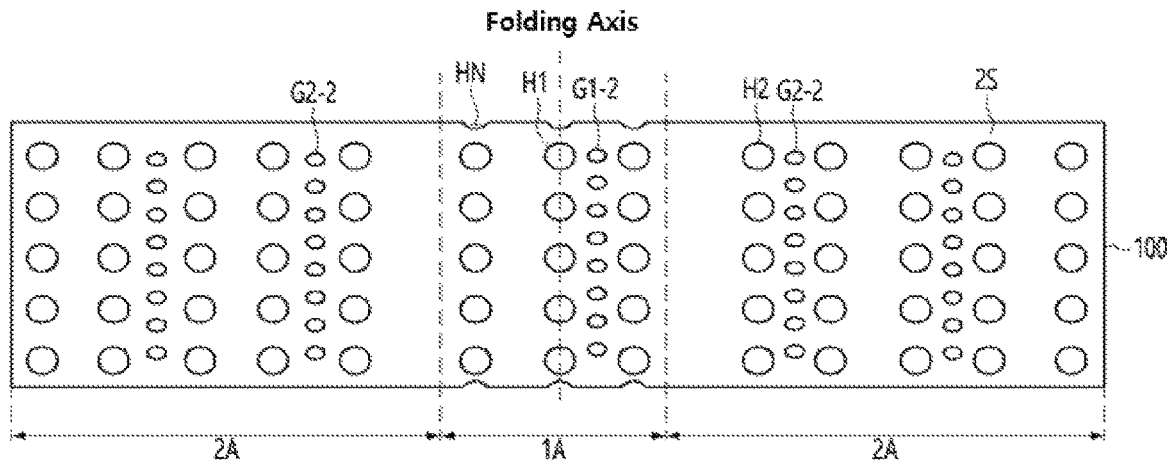
【FIG. 11】
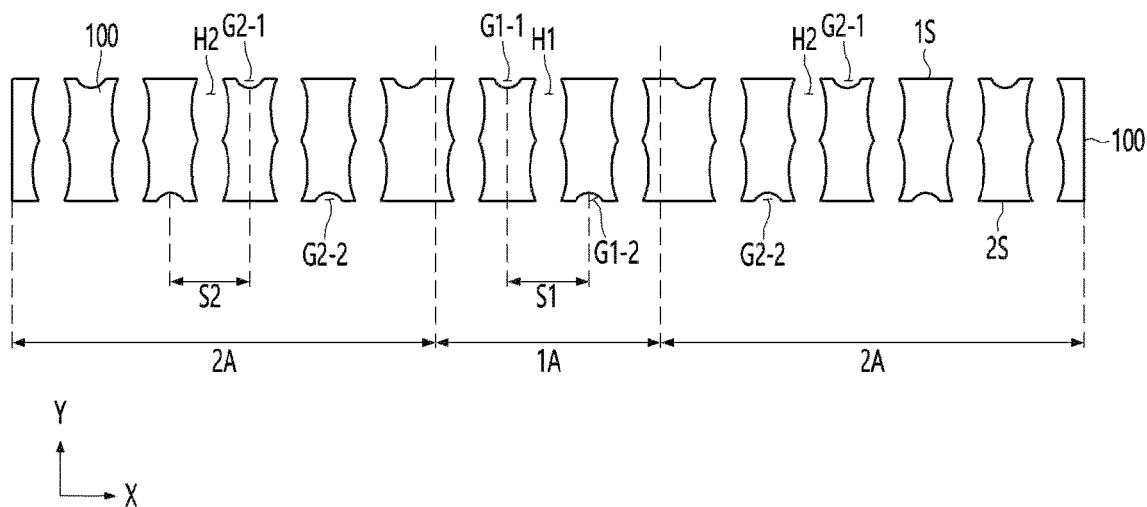
【FIG. 12】
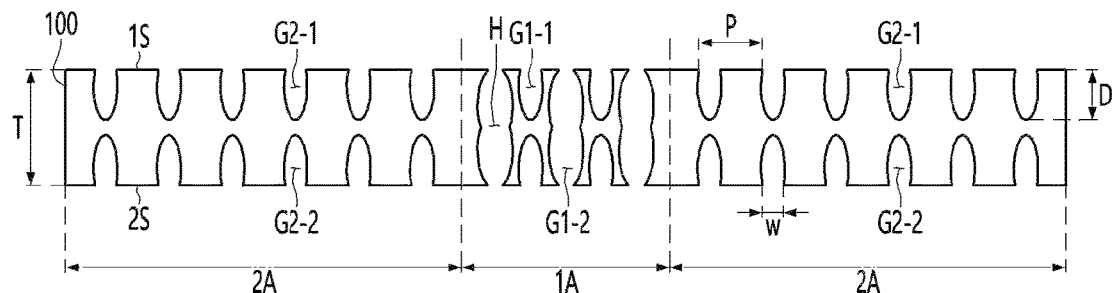

【FIG. 13】
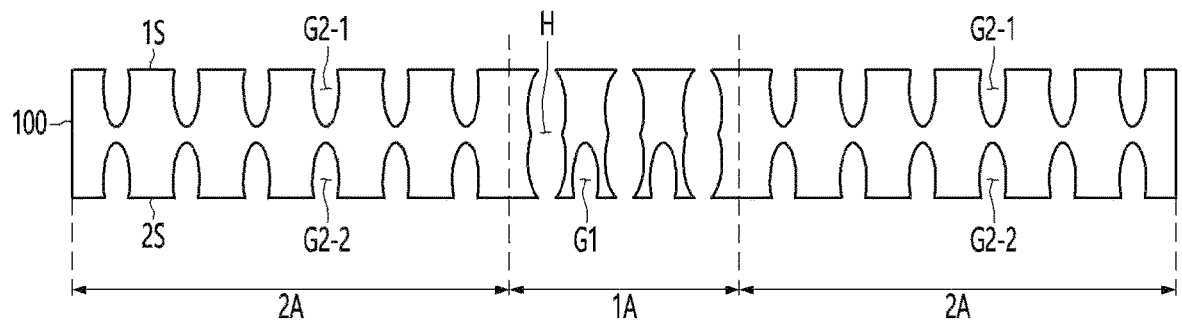
【FIG. 14】
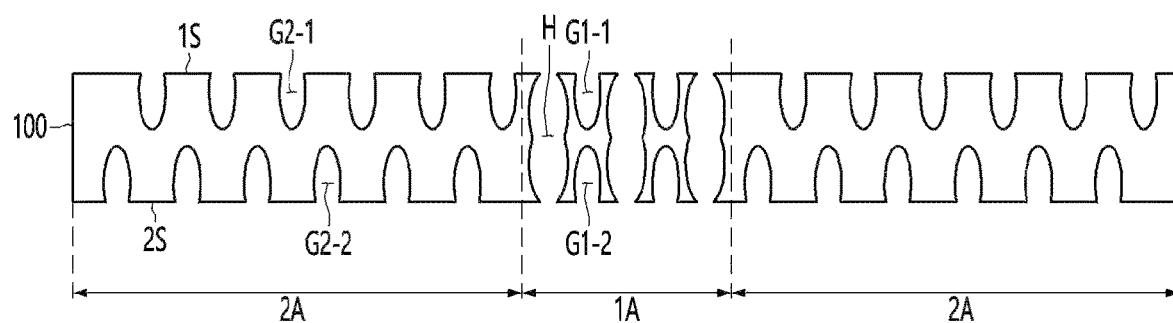
【FIG. 15】
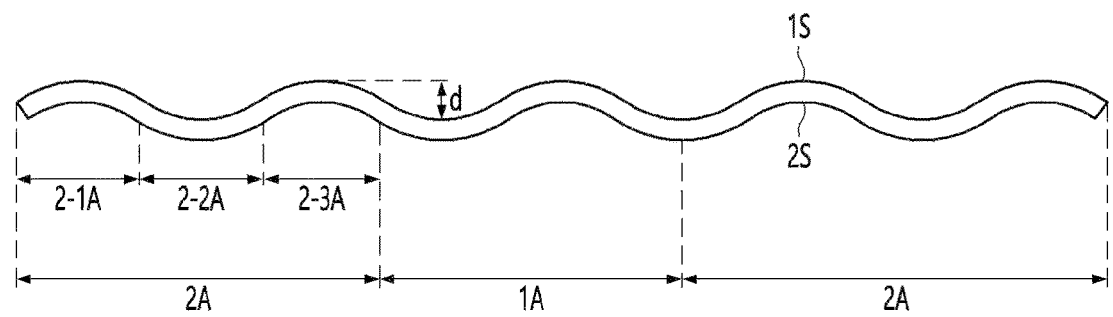

【FIG. 16】
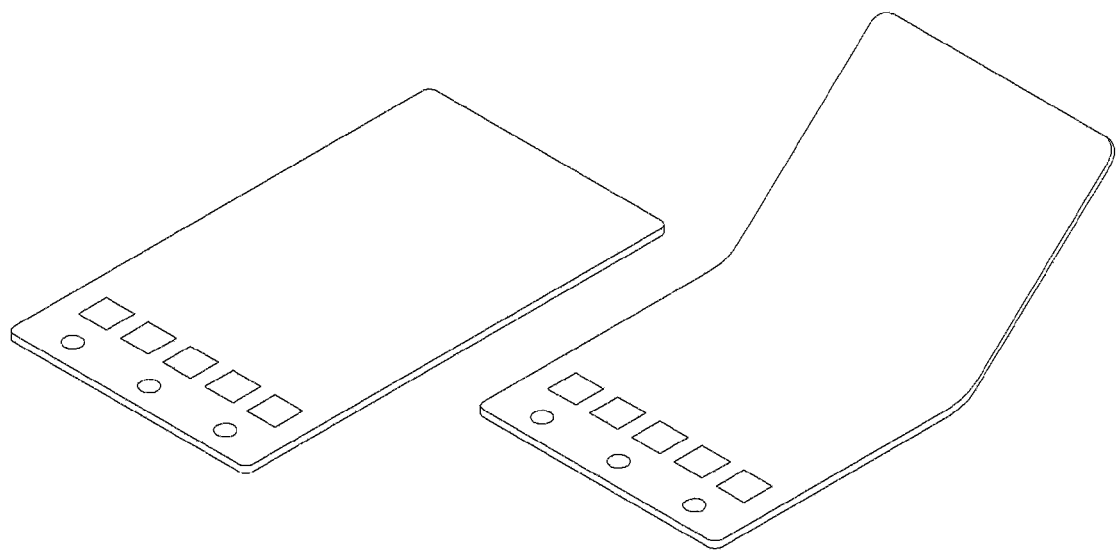

SUBSTRATE FOR DISPLAY INCLUDING PLURALITY OF HOLES AND GROOVES

CROSS-REFERENCE TO RELATED PATENT APPLICATIONS

This application is a U.S. National Stage Application under 35 U.S.C. § 371 of PCT Application No. PCT/KR2020/009877, filed Jul. 27, 2020, which claims priority to Korean Patent Application Nos. 10-2019-0098960, filed Aug. 13, 2019 and 10-2019-0109858, filed Sep. 5, 2019, whose entire disclosures are hereby incorporated by reference.

TECHNICAL FIELD

Embodiments relate to a substrate for display capable of controlling waviness.

BACKGROUND ART

Recently, there is an increasing demand for a flexible or foldable display device capable of easily carrying various applications and displaying an image on a large screen when being carried.

Such a flexible or foldable display device is folded or partially bent when being carried or stored, and may be implemented with the display unfolded when displaying images. Accordingly, an image display area may be increased, and a user may easily carry the display.

After the flexible or foldable display device is folded or bent, a restoration process of unfolding the flexible display device again may be repeated.

That is, since the flexible or foldable display device repeats folding and unfolding operations, the substrate of the flexible or foldable display device is required to have a certain strength and elasticity, and cracks and deformations should not occur in the substrate during folding and restoring.

Meanwhile, the substrate for display constituting the flexible or foldable display device generally uses a metal substrate. In addition, in the metal substrate, a stress release pattern such as holes or grooves may be formed in a folding area or an unfolding area of the metal substrate in order to disperse stress due to folding.

Meanwhile, since the metal substrate undergoes a cold rolling process before pattern formation, random waveness may be formed on a surface of the metal substrate.

Such waveness may cause deformation on the surface of the metal substrate, thereby affecting reliability of the substrate for display.

Therefore, there is a need for a substrate for display of a new structure capable of controlling the waveness of the surface of the metal substrate.

DISCLOSURE

Technical Problem

An embodiment is directed to providing a foldable display capable of maintaining a shape of a substrate for display by controlling waveness of a surface of the substrate.

An embodiment is directed to providing a substrate for display having folding properties and heat dissipation characteristics, and a substrate for display including the same.

Technical Solution

A substrate for display according to an embodiment includes one surface and the other surface opposite to the one surface, and a first area and a second area, wherein the one surface is folded to face each other, the first area is defined as a folding area, the second area is defined as an unfolding area, a first hole passing through the one surface and the other surface is formed in the first area, a 1-1 groove is formed on the one surface of the first area from the one surface toward the other surface, a 1-2 groove is formed on the other surface of the first area from the other surface toward the one surface, a 2-1 groove is formed on the one surface of the second area from the one surface toward the other surface, a 2-2 groove is formed on the other surface of the second area from the one surface toward the other surface, the 1-1 groove and the 1-2 groove do not overlap each other in a thickness direction of the substrate for display, and the 2-1 groove and the 2-2 groove do not overlap each other in the thickness direction of the substrate for display.

Advantageous Effects

A substrate for display according to an embodiment may include a hole for releasing stress and a first groove and a second groove for controlling the stress.

Accordingly, it is possible to disperse stress generated due to folding by forming a plurality of first holes in the substrate for display, thereby preventing an occurrence of cracks or the like in the substrate for display by folding. Therefore, it is possible to improve reliability of the substrate for display.

In addition, it is possible to form artificial waveness on one surface and the other surface of the substrate for display by forming a plurality of first and second grooves in the substrate for display in a position that does not overlap each other in a direction perpendicular to a thickness direction of the substrate for display.

That is, the substrate for display may be implemented in a wavy shape as a whole by the first groove and the second groove formed alternately with each other. That is, rigidity may be improved while securing a shape-retaining force of the substrate for display when restoring after folding the substrate for display by controlling the stress so that the waveness formed on the substrate for display is formed in a specific area.

Therefore, in the substrate for display according to the embodiment, when folding the substrate, it is possible to improve the folding reliability by dispersing the stress by the through-hole, and when restoring after folding the substrate, it is possible to improve the shape-retaining force and the rigidity by controlling the stress by the groove.

In addition, the substrate for display according to the embodiment may include a plurality of grooves formed in the folding area and the unfolding area.

Such grooves may increase a surface roughness, that is, a roughness of the substrate for display. That is, a surface area of the substrate for display may be increased by the grooves that are formed by partially etching the substrate for display.

Accordingly, heat dissipation characteristics of the substrate for display may be improved by the grooves. That is, a heat dissipation area of the substrate for display is increased by the grooves, and accordingly, the overall heat dissipation characteristic of the substrate for display may be improved.

Accordingly, in a display device to which the substrate for display is applied, a separate heat dissipation substrate for a heat dissipation function may be omitted. That is, since foldable properties of the substrate for display is improved by the holes and grooves formed in the substrate for display, the heat dissipation area of the substrate for display is increased to improve heat dissipation characteristics, so that the separate heat dissipation substrate may be omitted.

Therefore, it is possible to reduce the thickness of the display device to which the substrate for display according to the embodiment is applied. In addition, it is possible to prevent deterioration of the folding properties due to the heat dissipation substrate, and thus the folding properties may be improved.

DESCRIPTION OF DRAWINGS

FIGS. 1 and 2 are perspective views of a foldable display device according to an embodiment.

FIG. 3 is a perspective view of a foldable substrate for display according to an embodiment.

FIG. 4 is a side view of the foldable substrate for display according to the embodiment before folding.

FIG. 5 is a side view of the substrate for display according to the embodiment after folding.

FIG. 6 is a top view of one surface of the foldable substrate for display according to the embodiment.

FIG. 7 is a top view of the other surface of the substrate for display according to the embodiment.

FIG. 8 is a cross-sectional view taken along line A-A' in FIG. 6.

FIG. 9 is a top view of one surface of a foldable substrate for display according to another embodiment.

FIG. 10 is a top view of the other surface of a substrate for display according to another embodiment.

FIG. 11 is a cross-sectional view taken along line B-B' in FIG. 9.

FIGS. 12 to 14 are cross-sectional views of a substrate for display according to still another embodiment.

FIG. 15 is a side view of a substrate for display according to an embodiment.

FIG. 16 is a view for describing an example in which a foldable substrate for display according to an embodiment is applied.

MODES OF THE INVENTION

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (A, and (b) may be used. These terms are only used to distinguish the elements from other elements, and the terms are not limited to the essence, order, or order of the elements.

In addition, when an element is described as being "connected", "coupled", or "connected" to another element, it may include not only when the element is directly "connected" to, "coupled" to, or "connected" to other elements, but also when the element is "connected", "coupled", or "connected" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, a substrate for display according to an embodiment will be described with reference to drawings.

FIGS. 1 and 2 are perspective views of a foldable display device according to an embodiment.

Referring to FIG. 1, a foldable display device 1000 according to an embodiment may include a substrate 100 and a display panel 200 disposed above the substrate 100.

The substrate 100 may support the display panel 200. That is, the substrate 100 may be a support substrate supporting the display panel 200.

The substrate 100 may include a material such as metal. For example, the substrate 100 may include metal, metal alloy, plastic, a composite material (e.g., carbon fiber reinforced plastic, a magnetic or conductive material, a glass fiber reinforced material, etc.), ceramic, sapphire, glass, and the like.

The substrate 100 may be flexible or foldable. That is, the substrate 100 may be folded or bent in one direction. That is, the substrate 100 may be a substrate for display applied to a flexible display device or a foldable display device.

The substrate 100 may include at least two areas. In detail, the substrate 100 may include a first area 1A and a second area 2A.

The first area 1A may be defined as an area where the substrate 100 is folded. That is, the first area 1A may be a folding area.

In addition, the second area 2A may be defined as an area where the substrate 100 is not folded. That is, the second area 2A may be an unfolding area.

The first area 1A and the second area 2A will be described in detail below.

The substrate 100 may include an effective area AA and an ineffective area UA. The effective area AA may be defined as an area where the display panel 200 is disposed. That is, the effective area AA may be a display panel installation area. In addition, the ineffective area UA may be defined as an area surrounding the effective area AA as an area where the display panel 200 is not disposed. That is, the ineffective area UA may be a bezel area.

The substrate 100 may have a predetermined thickness. In detail, the substrate 100 may have a thickness of about 1000 µm or less. In more detail, the substrate 100 may have a thickness of about 30 µm to 1000 µm.

When the thickness of the substrate 100 exceeds about 1000 µm, cracks may occur due to the thickness of the substrate 100 when folding the display device, and when the thickness of the substrate 100 is less than about 30 μm, strength of the substrate 100 is lowered, and thus the role of the supporting substrate may be difficult.

The display panel 200 may be disposed above the substrate 100. In detail, the display panel 200 may be disposed on the effective area AA of the substrate 100.

The display panel 200 may include a plurality of pixels including a switching thin film transistor, a driving thin film transistor, a power storage device, and an organic light-emitting diode (OLED). In case of the OLED, deposition may be performed at a relatively low temperature, and the OLED may be mainly applied to a flexible or foldable display device for reasons such as low power and high luminance. Here, a pixel refers to a minimum unit for displaying an image, and the display panel displays an image through a plurality of pixels.

The display panel may include a substrate, a gate line disposed on the substrate, a data line crossing with the gate line in isolation, and a common power line. In general, one pixel may be defined by the gate line, the data line, and the common power line as a boundary.

The substrate may include a material having flexible properties such as a plastic film, and the display panel 200 may be implemented by disposing an organic light-emitting diode and a pixel circuit on a flexible film.

Referring to FIG. 2, the foldable display device 1000 according to the embodiment may further include a touch panel 300.

The touch panel 300 may be disposed above the display panel 200. In detail, the touch panel 300 may be disposed above the display panel 200 on an area corresponding to the effective area AA of the substrate 100.

The touch panel 300 may implement a touch function in the flexible display device, and the touch panel may be omitted in the foldable display device that simply displays an image without the touch function.

The touch panel 300 may include a substrate and a touch electrode disposed on the substrate. The touch electrode may sense a position of an input device that is touched on the flexible or foldable display device using a capacitance type or a resistive film type.

The substrate of the touch panel 300 may include a material having flexible properties such as a plastic film, and the touch panel 300 may be implemented by disposing the touch electrode on the flexible film.

Meanwhile, although not shown in the drawing, a cover window protecting the foldable display device may be additionally disposed above the touch panel 300 or above the display panel 200 (when the touch panel is omitted).

Meanwhile, the substrate 100, the display panel 200, and the touch panel 300 may be adhered to each other through an adhesive layer or the like. In this case, when the substrate 100 and the display panel 200 are adhered to each other, the adhesive layer may not be disposed in the first area, that is, the folding area, of the substrate 100, and the adhesive layer may be disposed in only the second area, that is, the unfolding area to be adhered to each other, or the adhesive layer may be disposed on the entire surface of the first or second areas to be adhered.

As described above, the flexible display device includes the substrate 100.

Referring to FIG. 3, the substrate 100 may be bent in one direction.

In detail, the substrate 100 may include one surface 1S and the other surface 2S opposite to the one surface 1S. The one surface 1S of the substrate 100 may be defined as a surface facing the display panel 200, and the other surface 2S of the substrate 100 may be defined as a surface opposite to the one surface 1S. That is, the display panel 200 may be disposed on the one surface 1S of the substrate 100.

In the substrate 100, the one surface 1S or the other surface 2S may be bent to face each other.

In the following description, as shown in FIG. 3, it will be mainly described that the one surfaces 1S are bent in a direction facing each other in the substrate 100.

As described above, the first area 1A and the second area 2A may be defined in the substrate 100. The first area 1A and the second area 2A may be areas defined when the one surfaces 1S are bent in the direction facing each other in the substrate 100.

In detail, the substrate 100 is bent in one direction, and the substrate 100 may be divided into the first area 1A which is a folded area (folding area) and the second area 2A which is an unfolded area (unfolding area).

Referring to FIG. 4 and FIG. 5, the substrate 100 may include the first area 1A that is an area where the substrate 100 is bent. The substrate 100 may include the second area 2A that is not bent and is disposed adjacent to the first area 1A.

For example, the second area 2A may be formed on the left side and the right side of the first area 1A based on the direction in which the substrate 100 is bent. That is, the second area 2A may be disposed at both ends of the first area 1A. That is, the first area 1A may be disposed between the second areas 2A.

The first area 1A and the second area 2A may be formed on the same substrate 100. That is, the first area 1A and the second area 2A may be formed integrally with each other without being separated on the same substrate 100.

Sizes of the first area 1A and the second area 2A may be different from each other. In detail, the size of the second area 2A may be larger than the size of the first area 1A.

In the drawings, it is illustrated that the first area 1A is positioned in a central portion of the substrate 100, but the embodiment is not limited thereto. That is, the first area 1A may be positioned in one end and an end area of the substrate 100. That is, the first area 1A may be positioned at one end and the end area of the substrate 100 such that the size of the second area 2A is asymmetric.

FIG. 5 is a side view of the substrate for display after the substrate is folded.

Referring to FIG. 5, the substrate 100 may be folded in one direction around a folding axis. In detail, the one surface 1S may be folded in a direction facing each other along the folding axis.

As the substrate 100 is folded in one direction, the first area 1A and the second area 2A may be formed on the substrate 100. That is, the folding area formed by folding the substrate 100 in one direction and the unfolding area positioned at both ends of the folding area may be formed in the substrate 100.

The folding area may be defined as an area where a curvature R is formed, and the unfolded area may be defined as an area where the curvature R is not formed or the curvature is close to zero.

Referring to FIGS. 4 and 5, the substrate 100 may be folded in one direction to be formed in an order of the unfolding area, the folding area, and the unfolding area.

A plurality of holes may be formed in at least one of the first area 1A and the second area 2A to control and disperse stress generated when the substrate 100 is folded.

Hereinafter, patterns such as holes and grooves formed in a substrate for display according to an embodiment will be described with reference to FIGS. 6 to 12.

First, a substrate for display according to an embodiment will be described with reference to FIGS. 6 to 8.

FIGS. 6 and 7 are top views of one surface and the other surface of the substrate for display according to the embodiment, respectively. In detail, FIG. 6 is a top view of one surface 1S of the substrate that is a folding inner surface when the substrate 100 is folded, and FIG. 7 is a top view of the other surface 2S of the substrate that is a folding outer surface when the substrate 100 is folded.

In addition, FIG. 8 is a cross-sectional view taken along line A-A' in FIG. 6.

Referring to FIGS. 6 and 7, a plurality of holes and a plurality of grooves passing through the display substrate 100 may be formed in the display substrate 100.

For example, a first hole H1 may be formed in the first area 1A of the display substrate 100. That is, the plurality of holes may be formed in the folding area of the display substrate 100.

In detail, a plurality of holes H1 passing through the display substrate 100 may be formed in the first area 1A of the display substrate 100. That is, the plurality holes H1 passing through the display substrate 100 may be formed in the folding area of the display substrate 100. That is, the first hole H1 may be formed to pass through one surface and the other surface of the display substrate 100. The first holes H1 may be formed to be spaced apart from each other in the first area 1A.

Meanwhile, FIGS. 6 and 7 illustrate only three first holes in a row direction and five first holes in a column direction that are formed in the first area 1A, but this is for convenience of description, and more or fewer first holes may be formed in the first area 1A in the row direction or the column direction, which may be equally applied to following cross-sectional views.

The plurality of first holes H1 formed in the first area 1A may serve to release stress applied to the display substrate by dispersing stress generated when the first area is folded. That is, the first hole H1 may be defined as a stress release pattern In detail, deformation and damage according to the stress may occur in the first area 1A of the substrate due to compressive stress generated when the substrate 100 is folded.

Therefore, it is possible to prevent the stress from being concentrated on a specific area of the first area 1A by forming the plurality of first holes H1 in the first area 1A. Therefore, it is possible to prevent the substrate from being damaged due to the compressive stress generated when the substrate 100 is folded.

That is, it is possible to reduce the magnitude of the compressive stress generated in the first area 1A when folding the substrate for display by forming a plurality of holes in the first area 1A to reduce an area of the substrate that generates stress in the first area 1A that is a folding area.

The first holes H1 may be formed in a regular pattern in the first area 1A. Alternatively, the first holes H1 may be formed in an irregular pattern in the first area 1A.

The first holes H1 may be formed to have a curved surface. In detail, the first holes H1 may be formed in a shape having a curved surface such as an elliptical shape, a hemispherical shape, a circular shape, or the like.

As an example, the first holes H1 may be formed in an elliptical shape having a major axis and a minor axis.

However, the embodiment is not limited thereto, and the first holes H1 may be formed in a polygonal shape such as a triangle, a square, or the like.

In addition, a plurality of grooves may be formed in the first area 1A and the second area 2A of the display substrate 100.

In detail, referring to FIGS. 6 and 7, a plurality of grooves formed in the first area 1A and the second area 2A may be formed on one surface 1S of the display substrate 100.

In detail, a 1-1 groove G1-1 may be formed in the first area 1A of the one surface 1S of the display substrate 100, and a 1-2 groove G1-2 may be formed in the first area 1A of the other surface 2S of the display substrate 100.

In addition, a 2-1 groove G2-1 may be formed in the second area 2A of the one surface 1S of the display substrate 100, and a 2-2 groove G2-2 may be formed in the second area 2A of the other surface 2S of the display substrate 100.

The 1-1 groove G1-1 and the 1-2 groove G1-2 may be disposed between the first holes H1 on the first area 1A. At least one of the 1-1 groove G1-1 and the 1-2 groove G1-2 may be formed between the first holes H1. That is, a column of the 1-1 groove G1-1 and a column of the 1-2 groove G1-2 are disposed between columns of the first hole H1 on the first area 1A.

In addition, the 2-1 groove G2-1 and the 2-2 groove G2-2 may be disposed on the second area 2A. In detail, the 2-1 grooves G2-1 may be disposed to be spaced apart from each other on the second area 2A, and the 2-2 grooves G2-2 may be disposed to be spaced apart from each other on the second area 2A. That is, columns of the 2-1 groove G2-1 may be disposed to be spaced apart from each other on the second area, and columns of the 2-2 may be disposed to be spaced apart from each other on the second area 2A. The 1-1 groove G1-1, the 1-2 groove G1-2, the 2-1 groove G2-1, and the 2-2 groove G2-2 may be defined as a pattern for controlling stress remaining in the display substrate 100. That is, the 1-1 groove G1-1, the 1-2 groove G1-2, the 2-1 groove G2-1, and the 2-2 groove G2-2 may be defined as a stress control pattern.

One surface and the other surface of the display substrate 100 in which the 1-1 groove G1-1, the 1-2 groove G1-2, the 2-1 groove G2-1, and the 2-2 groove G2-2 is formed may be bent in one direction due to a difference in stress between the one surface and the other surface, and in the embodiment, the direction of the bent area is controlled by the 1-1 groove G1-1, the 1-2 groove G1-2, the 2-1 groove G2-1, and the 2-2 groove G2-2, so that waveness of the display substrate may be controlled.

Accordingly, since waveness having a specific shape may be implemented, the shape retention force and rigidity of the display substrate may be secured by the waveness when the display substrate is restored after folding.

The 1-1 groove G1-1 and the 2-1 groove G2-1 may be formed to extend from one surface 1S toward the other surface 2S of the display substrate 100. That is, the 1-1 groove G1-1 and the 2-1 groove G2-1 may pass through one surface 1S of the display substrate 100, and may not pass through the other surface 2S of the display substrate 100.

In addition, the 1-2 groove G1-2 and the 2-2 groove G2-2 may be formed to extend from the other surface 2S toward the one surface 1S of the display substrate 100. That is, the 1-2 groove G1-2 and the 2-2 groove G2-2 may pass through the other surface 2S of the display substrate 100, and may not pass through the one surface 1S of the display substrate 100.

The 1-1 grooves G1-1 and the 2-1 grooves G2-1 may be formed to extend in a direction horizontal to the folding axis. That is, the 1-1 grooves G1-1 and the 2-1 grooves G2-1 may be formed to extend in a column in the direction horizontal to the folding axis.

In addition, the 1-2 grooves G1-2 and the 2-2 grooves G2-2 may be formed to extend in the direction horizontal to the folding axis. That is, the 1-2 grooves G1-2 and the 2-2 grooves G2-2 may be formed to extend in the column in the direction horizontal to the folding axis.

The 1-1 groove G1-1 and the 1-2 groove G1-2 may be formed at positions that do not overlap each other. In addition, the 2-1 groove G2-1 and the 2-2 groove G2-2 may be formed at positions that do not overlap each other. In detail, referring to FIG. 8, the 1-1 groove G1-1 and the 1-2 groove G1-2 may be formed at positions that do not overlap each other in a thickness direction (Y-direction) of the display substrate 100. In addition, the 2-1 groove G2-1 and the 2-2 groove G2-2 may be formed at positions that do not overlap each other in the thickness direction (Y-direction) of the display substrate 100.

In detail, the 1-1 groove G1-1 may be not formed on the one surface 1S of the display substrate 100 corresponding to the other surface 2S of the display substrate 100 in which the 1-2 groove G1-2 is formed, and the 1-2 groove G1-2 may be not formed on the other surface 2S of the display substrate 100 corresponding to the one surface 1S of the display substrate 100 in which the 1-1 groove G1-1 is formed.

In addition, the 2-1 groove G2-1 may be not formed on the one surface 1S of the display substrate 100 corresponding to the other surface 2S of the display substrate 100 in which the 2-2 groove G2-2 is formed, and the 2-2 groove G2-2 may be not formed on the other surface 2S of the display substrate 100 corresponding to the one surface 1S of the display substrate 100 in which the 2-1 groove G2-1 is formed.

That is, the 1-1 groove G1-1 and the 1-2 groove G1-2 may be alternately formed based on a direction (X-direction) perpendicular to the thickness direction of the display substrate 100. In addition, the 2-1 groove G2-1 and the 2-2 groove G2-2 may be alternately formed based on the direction (X-direction) perpendicular to the thickness direction of the display substrate 100.

An interval between the 1-1 groove G1-1 formed on the one surface 1S of the display substrate 100 and the 1-2 groove G1-2 formed on the other surface 2S of the display substrate 100 may be defined as a first interval S1. In addition, an interval between the 2-1 groove G2-1 formed on the one surface 1S of the display substrate 100 and the 2-2 groove G2-2 formed in the other surface 2S of the display substrate 100 may be defined as a second interval S2. At least one of the first interval S1 and the second interval S2 may be greater than the thickness of the display substrate 100 based on the direction perpendicular to the thickness direction of the display substrate 100.

That is, as described above, the display substrate 100 has a thickness of about 30 µm to 1000 µm, and at least one of the first interval S1 and the second interval S2 may be formed to be spaced apart by a distance greater than a thickness T of the display substrate 100.

When the first interval S1 or the second interval S2 is formed smaller than the thickness of the display substrate 100, the first interval S1 or the second interval S2 becomes too small, so that the 1-1 groove G1-1 and the 1-2 groove G1-2 may overlap or the 2-1 groove G2-1 and the 2-2 groove G2-2 may overlap during a process, and accordingly, it may be difficult to control the stress of the display substrate 100.

In addition, at least one 1-2 groove G1-2 may be formed between the 1-1 grooves G1-1. In addition, at least one 2-2 groove G2-2 may be formed between the 2-1 groove G2-1. That is, only one 1-2 groove G1-2 may be formed between the 1-1 grooves G1-1 or a plurality of 1-2 grooves G1-2 may be formed. In addition, only one 2-2 groove G2-2 may be formed between the 2-1 grooves G2-1 or a plurality of 2-2 grooves G2-2 may be formed.

At least one 1-1 groove G1-1 may be formed between the 1-2 grooves G1-2. In addition, at least one 2-1 groove G2-1 may be formed between the 2-2 grooves G2-2. That is, only one 1-1 groove G1-1 or a plurality of 1-1 grooves G1-1 may be formed between the 1-2 grooves G1-2. In addition, only one 2-1 groove G2-1 or a plurality of 2-1 groove G2-1 may be formed between the 2-2 grooves G2-2.

In addition, the 1-1 groove G1-1 and the 2-1 groove G2-1 may be formed in a depth of 50% or less of the thickness T of the display substrate 100, and the 1-2 groove G1-2 and the 2-2 groove G2-2 may be formed in a depth of 50% or less of the thickness T of the display substrate 100.

When a depth of the 1-1 groove G1-1, the 1-2 groove G1-2, the 2-1 groove G2-1, and the 2-2 groove G2-2 is formed in a depth exceeding 50% of the thickness T of the display substrate 100, the difference in stress on the one surface and the other surface of the display substrate is rapidly increased, so that shape deformation of the display substrate 100 may be intensified and flatness of the display substrate 100 may be deteriorated.

Meanwhile, the first area 1A and the second area 2A may be classified by the presence or absence of a hinge portion. That is, the folding area and the unfolding area may be classified by the presence or absence of the hinge portion.

In detail, a plurality of hinge portions may be formed in the first area 1A, and the hinge portions may not be formed in the second area 2A.

That is, the folding area may be defined as an area where a hinge portion HN is formed.

The hinge portion HN may be defined as a point at which folding starts in the substrate 100. That is, the substrate may start folding from the hinge portions of both ends among the plurality of hinge portions.

The hinge portion HN may include the plurality of hinge portions according to a folding shape of the substrate 100. The hinge portions HN may be formed at both ends of the substrate 100 overlapping a column direction in which the first holes H1 are formed based on a unidirectional length in a width direction of the substrate 100.

Accordingly, when the substrate 100 is folded by the hinge portion HN, the folding area may be easily folded.

The hinge portion HN may be formed by passing through one surface and the other surface of a unidirectional area among end areas of the substrate 100. That is, the hinge portion HN may be defined as a hole formed by passing through both end areas in the unidirectional direction among the end areas of the substrate 100.

A shape of the hinge portion HN may be the same as or different from a shape and size of the first holes H1. For example, the hole may be formed to have a curved surface. In detail, the hinge portion HN may be formed in a shape having a curved surface such as an elliptical shape, a hemispherical shape, or a circular shape.

However, the embodiment is not limited thereto, and of course, the hinge portion may be formed in a polygonal shape such as a triangular shape or a quadrangular shape, or an elliptical shape.

Hereinafter, a substrate for display according to another embodiment will be described with reference to FIGS. 9 to 11.

The substrate for display according to another embodiment may further include a second hole H2. Referring to FIGS. 9 and 10, the substrate for display according to another embodiment may further include the second hole H2 formed in the second area 2A. In detail, the second hole H2 may be formed in the second area 2A defined as an unfolding area. That is, holes may be formed in the entire area of the display substrate 100.

A plurality of second holes H2 spaced apart from each other may be formed in the second area 2A. The second hole H2 may be formed to pass through the display substrate 100. In detail, the second hole H2 may be formed to pass through the one surface 1S and the other surface 2S of the substrate 100.

Accordingly, the 2-1 groove G2-1 and the 2-2 groove G2-2 disposed in the second area 2A may be disposed between the second holes H2.

That is, the second hole H2 may be formed through the one surface 1S positioned inside the folding direction and the other surface 2S disposed outside the folding direction.

The second hole H2 may serve to reduce a difference in deformation due to heat in the first area 1A and the second area 2A in which the first hole H1 is formed.

In detail, the difference between the deformation due to heat in the first area 1A and the deformation due to heat in the second area 2A may be alleviated by forming holes in both the first area 1A and the second area 2A. Accordingly, it is possible to prevent the display substrate from being bent or distorted.

That is, a stress difference between the first area 1A and the second area 2A is released, so that it is possible to prevent a bending phenomenon of the display substrate due to the stress difference.

The second holes H2 may be formed in a regular pattern in the second area 2A, or the second holes H2 may be formed in an irregular pattern in the second area 2A.

The second hole H2 may be formed to have a curved surface. In detail, the second hole H2 may be formed in a shape having a curved surface such as an elliptical shape, a hemispherical shape, a circular shape, or the like.

As an example, the second hole H2 may be formed in an elliptical shape having a major axis and a minor axis.

In addition, the second hole H2 may have a size different from that of the first hole H1. For example, the second hole H2 may be smaller than the first hole H1.

However, the embodiment is not limited thereto, and of course, the second hole H2 may be formed in a polygonal shape such as a triangle, a square, or the like.

The first hole H1 and the second hole H2 may have the same shape and size. Alternatively, the first hole H1 and the second hole H2 may be formed to have different shapes or may have different sizes.

In addition, the plurality of grooves may be formed in the first area 1A and the second area 2A of the display substrate 100.

In detail, referring to FIG. 9, the 1-1 grooves G1-1 and the 2-1 grooves G2-1 formed in the first area 1A and the second area 2A may be formed on the one surface 1S of the display substrate 100, and referring to FIG. 10, the 1-2 grooves G1-2 and the 2-2 grooves G2-2 formed in the first area 1A and the second area 2A may be formed on the other surface 2S of the display substrate 100.

That is, the columns of the 1-1 groove G1-1 and the 1-2 groove G1-2 may be formed between the columns of the first hole H1 in the first area 1A, and the columns of the 2-1 groove G2-1 and the 2-2 groove G2-2 may be formed between the columns of the second hole H2 in the second area 2A.

The 1-1 groove G1-1, the 1-2 groove G1-2, the 2-1 groove G2-1, and the 2-2 groove G2-2 may be defined as a pattern for controlling stress remaining in the display substrate 100.

That is, the 1-1 groove G1-1, the 1-2 groove G1-2, the 2-1 groove G2-1 and the 2-2 groove G2-2 may be defined as a stress control pattern.

The one surface and the other surface of the display substrate 100 in which the 1-1 groove G1-1, the 1-2 groove G1-2, the 2-1 groove G2-1, and the 2-2 groove G2-2 is formed may be bent in one direction due to a difference in stress between the one surface and the other surface, and in the embodiment, the direction of the bent area is controlled by the 1-1 groove G1-1, the 1-2 groove G1-2, the 2-1 groove G2-1, and the 2-2 groove G2-2, so that waviness of the display substrate may be controlled.

Accordingly, since waviness having a specific shape may be implemented, a shape-retaining force and rigidity of the display substrate may be secured by the waveness when the display substrate is restored after folding.

The 1-1 groove G1-1 and the 2-1 groove G2-1 may pass through one surface 1S of the display substrate 100, and may not pass through the other surface 2S, and the 1-2 groove G1-2 and the 2-2 groove G2-2 pass through the other surface 2S of the display substrate 100, and may not pass through the one surface 1S.

The 1-1 grooves G1-1 and the 2-1 grooves G2-1 may be formed to extend in a direction horizontal to the folding axis. That is, the 1-1 grooves G1-1 and the 2-1 grooves G2-1 may be formed to extend in a column in the direction horizontal to the folding axis.

In addition, the 1-2 grooves G1-2 and the 2-2 grooves G2-2 may be formed to extend in the direction horizontal to the folding axis. That is, the 1-2 grooves G1-2 and the 2-2 grooves G2-2 may be formed to extend in the column in the direction horizontal to the folding axis.

The 1-1 groove G1-1 and the 1-2 groove G1-2 may be formed at positions that do not overlap each other. In addition, the 2-1 groove G2-1 and the 2-2 groove G2-2 may be formed at positions that do not overlap each other. In detail, referring to FIG. 11, the 1-1 groove G1-1 and the 1-2 groove G1-2 are formed at positions that do not overlap each other in the thickness direction of the display substrate 100. In addition, the 2-1 groove G2-1 and the 2-2 groove G2-2 may be formed at positions at positions that do not overlap each other in the thickness direction of the display substrate 100.

In detail, the 1-1 groove G1-1 may be not formed on the one surface 1S of the display substrate 100 corresponding to the other surface 2S of the display substrate 100 in which the 1-2 groove G1-2 is formed, and the 1-2 groove G1-2 may be not formed on the other surface 2S of the display substrate 100 corresponding to the one surface 1S of the display substrate 100 in which the 1-1 groove G1-1 is formed.

In addition, the 2-1 groove G2-1 may be not formed on the one surface 1S of the display substrate 100 corresponding to the other surface 2S of the display substrate 100 in which the 2-2 groove G2-2 is formed, and the 2-2 groove G2-2 may be not formed on the other surface 2S of the display substrate 100 corresponding to the one surface 1S of the display substrate 100 in which the 2-1 groove G2-1 is formed.

That is, the 1-1 groove G1-1 and the 1-2 groove G1-2, and the 2-1 groove G2-1 and the 2-2 groove G2-2 may be formed alternately with each other based on a direction perpendicular to the thickness direction of the display substrate 100.

When an interval between the 1-1 groove G1-1 formed on the one surface 1S of the display substrate 100 and the 1-2 groove G1-2 formed on the other surface 2S of the display substrate 100 is defined as a first interval S1, and an interval between the 2-1 groove G2-1 formed on the one surface 1S of the display substrate 100 and the 2-2 groove G2-2 formed in the other surface 2S of the display substrate 100 is defined as a second interval S2, at least one of the first interval S1 and the second interval S2 may be greater than the thickness of the display substrate 100 based on the direction perpendicular to the thickness direction of the display substrate 100.

That is, as described above, the display substrate 100 has a thickness of about 30 μm to 1000 μm, and at least one of the first and second intervals may be formed to be spaced apart by a distance greater than the thickness T of the display substrate 100 based on the direction perpendicular to the thickness direction of the display substrate 100.

When the first interval or the second interval is formed smaller than the thickness of the display substrate 100, the first interval or the second interval becomes too small, so that the 1-1 groove G1-1 and the 1-2 groove G1-2 may overlap or the 2-1 groove G2-1 and the 2-2 groove G2-2 may overlap during a process, and accordingly, it may be difficult to control the stress of the display substrate 100.

In addition, at least one 1-2 groove G1-2 may be formed between the 1-1 grooves G1-1. That is, only one 1-2 groove G1-2 or the plurality of 1-2 grooves G1-2 may be formed between the 1-1 grooves G1-1.

In addition, at least one 1-1 groove G1-1 may be formed between the 1-2 grooves G1-2. That is, only one 1-1 groove G1-1 or the plurality of 1-1 grooves G1-1 may be formed between the 1-2 grooves G1-2.

In addition, at least one 2-2 groove G2-2 may be formed between the 2-1 grooves G2-1. That is, only one 2-2 groove G2-2 or the plurality of 2-2 grooves G2-2 may be formed between the 2-1 grooves G2-1.

In addition, at least one 2-1 groove G2-1 may be formed between the 2-2 grooves G2-2. That is, only one 2-1 groove G2-1 or a plurality of 2-1 grooves G2-1 may be formed between the 2-2 grooves G2-2.

In addition, the 1-1 groove G1-1 and the 2-1 groove G2-1 may be formed in a depth of 50% or less of the thickness T of the display substrate 100, and the 1-2 groove G1-2 and the 2-2 groove G2-2 may be formed in a depth of 50% or less of the thickness T of the display substrate 100.

When a depth of the 1-1 groove G1-1, the 1-2 groove G1-2, the 2-1 groove G2-1, and the 2-2 groove G2-2 is formed in a depth exceeding 50% of the thickness T of the display substrate 100, the difference in stress on the one surface and the other surface of the display substrate is rapidly increased, so that shape deformation of the display substrate 100 may be intensified and flatness of the display substrate 100 may be deteriorated.

FIGS. 12 to 14 are cross-sectional views of a display substrate according to still another embodiment.

Referring to FIG. 12, in the display substrate according to still another embodiment, the 1-1 groove G1-1 and the 1-2 groove G2-1 may be disposed to overlap each other in the thickness direction of the display substrate 100. In addition, the 2-1 groove G2-1 and the 2-2 groove G2-2 may be disposed to overlap each other in the thickness direction of the display substrate 100.

Meanwhile, referring to FIG. 12, the grooves may be formed to have a predetermined interval, width, and depth. That is, the grooves may be formed to have a predetermined interval, width, and depth in order to optimize folding properties and heat dissipation characteristics of the display substrate.

In detail, a size of a width/depth w/D of the 2-1 groove G2-1 and the 2-2 groove G2-2 may be 0.5 to 3. Here, a size of widths of the 2-1 groove G2-1 and the 2-2 groove G2-2 may be defined as a size of a surface hole formed by the 2-1 groove G2-1 and the 2-2 groove G2-2. That is, the size of the widths of the 2-1 groove G2-1 and the 2-2 groove G2-2 may be defined as the size of the surface hole of the 2-1 groove G2-1 and the 2-2 groove G2-2.

In addition, a pitch P of the 2-1 groove G2-1 and the 2-2 groove G2-2 may be greater than the widths of the 2-1 groove G2-1 and the 2-2 groove G2-2.

Referring to FIG. 13, in the display substrate according to yet another embodiment, a groove may be formed on only one of one surface and the other surface in the first area 1A.

For example, in the first area 1A, a first groove G1 may be formed only on the other surface 2S of the display substrate 100, and in the second area 2A, the 2-1 groove G2-1 and the 2-2 groove G2-2 may be formed on the one surface 1S and the other surface 2S, respectively.

In addition, referring to FIG. 14, in the display substrate according to yet another embodiment, grooves are overlapped in one area of the first area 1A and the second area 2A, and the grooves may be formed to be offset in the other area of the first area 1A and the second area 2A.

For example, in the first area 1A, the 1-1 groove G1-1 and the 1-2 groove G1-2 may be disposed to overlap each other in the thickness direction of the display substrate 100, and in the second area 2A, the 2-1 groove G2-1 and the 2-2 groove G2-2 may be disposed to be offset from each other without overlapping in the thickness direction of the display substrate 100.

The substrate for display according to the embodiment may include holes for releasing stress and grooves for controlling stress.

Accordingly, it is possible to disperse stress generated due to folding by forming a plurality of holes in the substrate for display, thereby preventing an occurrence of cracks or the like in the substrate for display by folding. Therefore, it is possible to improve reliability of the substrate for display.

In addition, it is possible to form artificial waveness on one surface and the other surface of the substrate for display by forming a plurality of grooves in the substrate for display in a position that does not overlap each other in a direction perpendicular to a thickness direction of the substrate for display.

In detail, referring to FIG. 15, the substrate for display may be bent in different directions for each area by the 1-1 groove, the 1-2 groove, the 2-1 groove, and the 2-2 groove.

In detail, based on the second area 2A, a 2-1 area 2-1A and a 2-3 area 2-3A are areas where the 2-2 groove is formed on the other surface 2S of the substrate, and the substrate for display may be formed to be convex in the direction of the one surface 1S by depressing the other surface on which the 2-2 groove is formed. In addition, a 2-2 area 2-2A is an area where the 2-1 groove is formed on one surface 1S of the substrate, and in the substrate for display, one surface on which the 2-1 groove is formed may be recessed and may be formed convexly in the direction of the other surface 2S.

That is, the one surface 1S may be bent so that a distance d between one surface on which the 2-1 groove is formed and one surface on which the 2-1 groove is not formed is different by about 1 mm or less, and the other surface 2S may be bent so that a distance between one surface on which the 2-2 groove is formed and one surface on which the 2-2 groove is not formed is different by about 1 mm or less.

That is, after the 2-1 groove and the 2-2 groove are formed on one surface of the display substrate 100, when measuring after the other surface of the display substrate 100 is disposed on a support on a flat plane in order to measure a degree of warpage of the display substrate 100, the one surface 1S may be bent so that the distance d between the one surface on which the 2-1 groove is formed and the one surface on which the 2-1 groove is not formed is different by about 1 mm or less, and the other surface 2S may be bent so that the distance between the one surface on which the 2-2 groove is formed and the one surface on which the 2-2 groove is not formed is different by about 1 mm or less.

In this case, the distance d between the one surface on which the 2-1 groove is formed and the one surface on which the 2-1 groove is not formed may be not the distance d between the one surface on which the 2-1 groove is formed and the one surface on which the 2-1 groove is not formed, and the distance d between the one surface on which the 2-1 groove is formed and the one surface on which the 2-1 groove is not formed may be defined as a distance from the uppermost portion of the 2-1 area 2-1A, that is, one surface of the 2-1 area on which the 2-1 groove is not formed to the lowermost portion of the 2-2 area 2-2A, that is, one surface of the 2-2 area on which the groove 2-1 is not formed That is, the display substrate 100 may be implemented in a wavy shape as a whole by the first groove and the second groove formed alternately with each other. That is, the rigidity may be improved while securing the shape-retaining force of the display substrate 100 when restoring after folding the substrate for display by controlling the stress so that the waveness formed on the display substrate 100 is formed in a specific area.

Therefore, in the display substrate 100 according to the embodiment, when folding the substrate, it is possible to improve the folding reliability by dispersing the stress by the through-hole, and when restoring after folding the substrate, it is possible to improve the shape-retaining force and the rigidity by controlling the stress by the groove.

In addition, the 1-1 groove G1-1, the 1-2 groove G1-2, the 2-1 groove G2-1, and the 2-2 groove G2-2 may increase a surface roughness, that is, a roughness of the display substrate 100. That is, a surface area of the display substrate 100 may be increased by the 1-1 groove G1-1, the 1-2 groove G1-2, the 2-1 groove G2-1, and the 2-2 groove G2-2 that are formed by partially etching the display substrate 100.

Accordingly, heat dissipation characteristics of the display substrate 100 may be improved by the 1-1 groove G1-1, the 1-2 groove G1-2, the 2-1 groove G2-1, and the 2-2 groove G2-2. That is, a heat dissipation area of the display substrate 100 is increased by the 1-1 groove G1-1, the 1-2 groove G1-2, the 2-1 groove G2-1, and the 2-2 groove G2-2, and accordingly, the overall heat dissipation characteristics of the display substrate 100 may be improved.

Accordingly, in a display device to which a display substrate is applied, a separate heat dissipation substrate for a heat dissipation function may be omitted. That is, since foldable properties of the display substrate is improved by the holes and grooves formed in the display substrate, the heat dissipation area of the display substrate is increased to improve heat dissipation characteristics, so that the separate heat dissipation substrate may be omitted.

In addition, when the separate heat dissipation substrate is omitted and panels such as a display substrate and a display panel are adhered through an adhesive layer, an adhesive area of the display substrate is increased, so that adhesion between the display substrate and the display panel, thereby improving the reliability of the display device.

Therefore, it is possible to reduce the thickness of the display device to which the display substrate according to the embodiment is applied. In addition, it is possible to prevent deterioration of the folding properties due to the heat dissipation substrate, thereby improving the folding properties.

FIG. 16 is a view for describing an example in which a substrate for display according to embodiments is applied.

Referring to FIG. 16, the substrate for display according to the embodiments may be applied to a flexible display device that displays a display.

For example, the substrate for display according to the embodiments may be applied to a flexible display device such as a mobile phone or a tablet.

Such a substrate for display may be applied to flexible display devices such as a mobile phone, a tablet, and the like that are flexible, bent or folded.

The substrate for display is applied to the flexible display devices such as the mobile phone, the tablet, and the like that are flexible, bent or folded and may improve the reliability of the flexible display device by improving the folding reliability in the display device that is repeatedly folded or restored.

The characteristics, structures, effects, and the like described in the above embodiments are included in at least one embodiment of the present invention, but are not limited to only one embodiment. Furthermore, the characteristic, structure, and effect illustrated in each embodiment may be combined or modified for other embodiments by a person skilled in the art. Accordingly, it is to be understood that such combination and modification are included in the scope of the present invention.

In addition, the above description of the embodiments is merely examples and does not limit the present invention. It would be apparent to those of ordinary skill in the art that the present invention may be easily embodied in many different forms without changing the technical idea or essential features thereof. For example, elements of the embodiments described herein may be modified and realized. Also, it should be construed that differences related to such changes and applications are included in the scope of the present invention defined in the appended claims.

The invention claimed is:

1. A substrate for display comprising:
   one surface and the other surface opposite to the one surface; and
   a first area and a second area,
   wherein the one surface is folded to face each other,
   the first area is defined as a folding area, the second area is defined as an unfolding area,
   a first hole passing through the one surface and the other surface is formed in the first area,
   a 1-1 groove is formed on the one surface of the first area from the one surface toward the other surface,
   a 1-2 groove is formed on the other surface of the first area from the other surface toward the one surface,
   a 2-1 groove is formed on the one surface of the second area from the one surface toward the other surface,
   a 2-2 groove is formed on the other surface of the second area from the one surface toward the other surface,
   the 1-1 groove and the 1-2 groove do not overlap each other in a thickness direction of the substrate for display,
   the 2-1 groove and the 2-2 groove do not overlap each other in the thickness direction of the substrate for display, and
   at least one of the 1-1 groove, the 1-2 groove, the 2-1 groove and the 2-2 groove is formed in a depth of 50% or less of a thickness of the substrate for display.

2. The substrate for display of claim 1, wherein the 1-1 groove, the 1-2 groove, the 2-1 groove, and the 2-2 groove are formed to extend in a column in a direction horizontal to a folding axis of the substrate for display.

3. The substrate for display of claim 1, wherein an interval between the 1-1 groove and the 1-2 groove is defined as a first interval,
an interval between the 2-1 groove and the 2-2 groove is defined as a second interval,
at least one of the first interval and the second interval is greater than the thickness of the substrate for display based on a direction perpendicular to the thickness direction of the substrate for display.

4. The substrate for display of claim 1, wherein at least one 1-2 groove is formed between the 1-1 grooves,
at least one 1-1 groove is formed between the 1-2 grooves,
at least one 2-2 groove is formed between the 2-1 grooves, and
at least one 2-1 groove is formed between the 2-2 grooves.

5. The substrate for display of claim 1, wherein a distance between one surface on which the 2-1 groove is formed and one surface on which the 2-1 groove is not formed and a distance between one surface on which the 2-2 groove is formed and one surface on which the 2-2 groove is not formed are 1 mm or less, respectively, and
the distance between the one surface on which the 2-1 groove is formed and the one surface on which the 2-1 groove is not formed and the distance between the one surface on which the 2-2 groove is formed and the one surface on which the 2-2 groove is not formed is defined as a distance from an uppermost portion to a lowermost portion of the second area.

6. The substrate for display of claim 1, wherein the 1-1 groove and the 1-2 groove formed in the first area are formed between columns of the first hole, and
at least one 1-1 groove and 1-2 groove is formed between the columns of the first hole.

7. The substrate for display of claim 1, further comprising a plurality of second holes formed in the second area,
wherein the 2-1 groove and the 2-2 groove are formed between columns of the second hole on the second area, and
at least one 2-1 groove and 2-2 groove are formed between the columns of the second hole.

8. The substrate for display of claim 7, wherein a size of the second hole is smaller than a size of the first hole.

9. The substrate for display of claim 7, wherein the 1-1 groove and the 1-2 groove formed in the first area are formed between the columns of the first hole, and
the 2-1 groove and the 2-2 groove formed in the second area are formed between the columns of the second holes.

10. The substrate for display of claim 7, wherein an interval between the 1-1 groove and the 1-2 groove is defined as a first interval,
an interval between the 2-1 groove and the 2-2 groove is defined as a second interval,
at least one of the first interval and the second interval is greater than the thickness of the substrate for display based on a direction perpendicular to the thickness direction of the substrate for display.

11. The substrate for display of claim 7, wherein at least one 1-2 groove is formed between the 1-1 grooves,
at least one 1-1 groove is formed between the 1-2 grooves,
at least one 2-2 groove is formed between the 2-1 grooves, and
at least one 2-1 groove is formed between the 2-2 grooves.

12. The substrate for display of claim 7, wherein a distance between one surface on which the 2-1 groove is formed and one surface on which the 2-1 groove is not formed and a distance between one surface on which the 2-2 groove is formed and one surface on which the 2-2 groove is not formed are 1 mm or less, respectively, and
the distance between the one surface on which the 2-1 groove is formed and the one surface on which the 2-1 groove is not formed and the distance between the one surface on which the 2-2 groove is formed and the one surface on which the 2-2 groove is not formed is defined a distance from an uppermost portion to a lowermost portion of the second area.

13. The substrate for display of claim 1, wherein a size of a width/depth of the 2-1 groove and the 2-2 groove is 0.5 to 3.

14. The display device of claim 1, wherein a pitch P of the 2-1 groove and the 2-2 groove is greater than a width of the 2-1 groove and the 2-2 groove.

15. A display device comprising;
a substrate for display; and
at least one of a display panel and a touch panel disposed above the substrate for display,
wherein the substrate for display includes one surface and the other surface opposite to the one surface,
the one surface is folded to face each other,
the substrate for display includes a first area defined as a folding area and a second area defined as an unfolding area,
a first hole passing through the one surface and the other surface in the first area,
a 1-1 groove is formed on the one surface of the first area from the one surface toward the other surface,
a 1-2 groove is formed on the other surface of the first area from the other surface toward the one surface,
a 2-1 groove is formed on the one surface of the second area from the one surface toward the other surface,
a 2-2 groove is formed on the other surface of the second area from the one surface toward the other surface,
the 1-1 groove and the 1-2 groove do not overlap each other in a thickness direction of the substrate for display,
the 1-1 groove, the 1-2 groove, the 2-1 groove, and the 2-2 groove do not overlap each other in the thickness direction of the substrate for display, and
at least one of the 1-1 groove, the 1-2 groove, the 2-1 groove and the 2-2 groove is formed in a depth of 50% or less of a thickness of the substrate for display.

16. The display device of claim 15, wherein an interval between the 1-1 groove and the 1-2 groove is defined as a first interval,
an interval between the 2-1 groove and the 2-2 groove is defined as a second interval,
at least one of the first interval and the second interval is greater than the thickness of the substrate for display based on a direction perpendicular to the thickness direction of the substrate for display.

17. The display device of claim 15, wherein a distance between one surface on which the 2-1 groove is formed and one surface on which the 2-1 groove is not formed and a distance between one surface on which the 2-2 groove is formed and one surface on which the 2-2 groove is not formed are 1 mm or less, respectively, and
the distance between the one surface on which the 2-1 groove is formed and the one surface on which the 2-1 groove is not formed and the distance between the one surface on which the 2-2 groove is formed and the one surface on which the 2-2 groove is not formed is defined as a distance from an uppermost portion to a lowermost portion of the second area.

18. The display device of claim 15, wherein the 1-1 groove, the 1-2 groove, the 2-1 groove, and the 2-2 groove are formed to extend in a column in a direction horizontal to a folding axis of the substrate for display.

19. The display device of claim 15, wherein at least one 1-2 groove is formed between the 1-1 grooves,
at least one 1-1 groove is formed between the 1-2 grooves,
at least one 2-2 groove is formed between the 2-1 grooves, and
at least one 2-1 groove is formed between the 2-2 grooves.

20. The display device of claim 15, further comprising a plurality of second holes formed in the second area,
wherein the 2-1 groove and the 2-2 groove are formed between the columns of the second hole on the second area, and
at least one 2-1 groove and 2-2 groove is formed between the columns of the second hole.

* * * * *